United States Patent
Wang et al.

(10) Patent No.: US 10,690,588 B2
(45) Date of Patent: Jun. 23, 2020

(54) SYSTEM FOR MEASURING TRANSPORT PROPERTIES OF MATERIALS AND RELATED METHOD

(71) Applicant: Ningbo Molian Materials Technology Inc., Ningbo (CN)

(72) Inventors: Xiao-ping Wang, Shanghai (CN); Xiao-dong Xiang, Danville, CA (US)

(*) Notice: Subject to any disclaimer, the term of this patent is extended or adjusted under 35 U.S.C. 154(b) by 0 days.

(21) Appl. No.: 16/041,789

(22) Filed: Jul. 21, 2018

(65) Prior Publication Data
US 2019/0025196 A1 Jan. 24, 2019

Related U.S. Application Data

(60) Provisional application No. 62/535,763, filed on Jul. 21, 2017.

(51) Int. Cl.
*G01N 21/21* (2006.01)
*G01J 4/04* (2006.01)
(Continued)

(52) U.S. Cl.
CPC .............. *G01N 21/211* (2013.01); *G01J 4/04* (2013.01); *G01N 25/005* (2013.01); *G01R 27/02* (2013.01);
(Continued)

(58) Field of Classification Search
CPC ........... G01N 21/211; G01N 2001/002; G01N 2021/213; G01N 2201/061;
(Continued)

(56) References Cited

U.S. PATENT DOCUMENTS

| 6,052,188 A * | 4/2000 | Fluckiger .................. G01J 4/04 356/369 |
| 2007/0009010 A1* | 1/2007 | Shio ..................... G01K 11/125 374/161 |

(Continued)

OTHER PUBLICATIONS

Noun, W., et al. "Correlation between electrical and ellipsometric properties on high-quality epitaxial thin films of the conductive oxide LaNiO 3 on STO (001)." Journal of Applied Physics 102.6 (2007): 063709 (Year: 2007).*

*Primary Examiner* — Dominic J Bologna
(74) *Attorney, Agent, or Firm* — Chen Yoshimura LLP

(57) ABSTRACT

A material transport property measurement system includes an ellipsometry system, a heat capacity measurement system, and a controller. The ellipsometry system has a light source to generate a light which passes through a polarizer and shines on a sample. The sample reflects the light to an integrated polarization analyzer, which includes multiple polarizers with different polarization angles distributed from 0 to 180 degrees. A detector assembly includes multiple detectors corresponding to the multiple polarizers to detect light passing through the respective polarizers and generate multiple first electrical signals. The heat capacity measurement system measures a temperature parameter of the sample using a non-contact method, and outputs a second electrical signal. The controller analyzes the second and the multiple first electrical signals to obtain the transport properties of the material. A material transport property measurement method is also provided.

12 Claims, 8 Drawing Sheets

(51) Int. Cl.
  *H01S 3/10* (2006.01)
  *G01N 25/00* (2006.01)
  *G01R 31/28* (2006.01)
  *G01R 27/02* (2006.01)
  *G01N 1/00* (2006.01)
  *G01J 4/00* (2006.01)

(52) U.S. Cl.
  CPC ............ *G01R 31/2831* (2013.01); *H01S 3/10* (2013.01); *G01J 2004/001* (2013.01); *G01N 2001/002* (2013.01); *G01N 2021/213* (2013.01); *G01N 2201/061* (2013.01); *G01N 2201/0636* (2013.01)

(58) Field of Classification Search
  CPC ................ G01N 2201/0636; G01J 4/04; G01J 2204/001; G01R 31/2831; H01L 22/14; H01S 3/10
  See application file for complete search history.

(56) References Cited

U.S. PATENT DOCUMENTS

| | | | | |
|---|---|---|---|---|
| 2010/0302541 | A1* | 12/2010 | Gao | G01B 11/0641 356/369 |
| 2013/0010296 | A1* | 1/2013 | Kwak | G01N 21/211 356/369 |
| 2015/0118766 | A1* | 4/2015 | Xu | H01L 22/14 438/10 |

* cited by examiner

SYSTEM FOR MEASURING TRANSPORT PROPERTIES OF MATERIALS AND RELATED METHOD

BACKGROUND OF THE INVENTION

Field of the Invention

The present invention generally relates to methods and apparatus of materials optical property measurement technologies, and in particular, it relates to measurement system and method for measuring transport properties of materials.

Description of Related Art

Transport properties are the basic properties of materials, including dc (direct current) conductivity $\sigma_0$, carrier concentration $n_e$, relaxation time $\tau$, electron effective mass $m^*_e$, mobility $\mu$ etc. Usually, obtaining these parameters requires a variety of measurement techniques, such as measuring the dc conductivity by the four-electrode method, measuring the carrier concentration by the Hall method, and calculating the mobility based on these. However, the four-electrode method and the Hall method cannot independently obtain the relaxation time and the electron effective mass.

Therefore, methods of measuring the dc conductivity $\sigma_0$, the relaxation time $\tau$, and the plasma frequency $\omega_p$ of the target material using ellipsometry techniques are used, as described in W. Noun et al., J. Appl. Phys. 102, 063709 (2007) and M. Dressel et al., Electrodynamics of Solids (2003). However, current ellipsometry methods to obtain optical properties of materials is slow, so the transport properties of materials can not be obtained rapidly.

In addition, the effective mass $m^*_e(k)$, the relaxation time $\tau(k)$, and the carrier concentration $n_e(k)$ in k-space can be extracted by measuring the three-dimensional electronic structure using angle-resolved photoelectron spectroscopy. Then the macroscopic carrier concentration, average relaxation time, electron effective mass, and average mobility can be calculated. This method is mentioned in C. Kittel, Introduction to Solid State Physics (2004). But it is only applicable for single crystal samples, and is also surface sensitive and cannot be widely used.

SUMMARY

The purpose of the present invention is to overcome problems of the conventional material transport property measurement systems, namely the inapplicability to high throughput measurement in composite material chips, slow measurement speed, and inability to completely measuring the transport properties. Embodiments of the present invention provide an apparatus and method for measuring the transport properties of materials.

To solve the above problems, embodiments of the present invention provide a material transport property measurement system, comprising an ellipsometry apparatus, a heat capacity measurement system, and a controller. The ellipsometry apparatus and the heat capacity measurement system are connected to the controller. The ellipsometry apparatus includes a light source, a polarizer, a sample stage, an integrated polarization analyzer and a detector assembly disposed along an optical path. The sample stage is configured to hold the sample being measured. The light emitted by the light source passes through the polarizer and shines on the sample, which reflects the light to the integrated polarization analyzer. The integrated polarization analyzer outputs multiple polarized light beams. The detector assembly is connected to the integrated polarization analyzer and detects the multiple polarized light signals, and converts the light signals to multiple first electrical signals and outputs them to the controller. The heat capacity measurement system measures a temperature parameter of the sample using a non-contact method, and converts the temperature parameter to a second electrical signal and outputs it to the controller. The controller analyzes the second and multiple first electrical signals to obtain the transport properties of the material.

Preferably, the integrated polarization analyzer comprises multiple polarizers, with different polarization angles distributed from 0° to 180°. The light reflected from the sample passes through the multiple polarizers. The detector assembly includes multiple detectors corresponding one-to-one with the polarizers, to detect the light signal from each polarizer independently.

Preferably, the detector assembly includes electronic readers electrically coupled to the detectors.

Preferably, multiple electronic readers are connected to the multiple detectors in a one-to-one correspondence, and independently reads out signals obtained by the corresponding detectors.

Preferably, a beam expander is located between the sample stage and the integrated polarization analyzer. The reflected light beam from the sample passes through the beam expander first and then enters the integrated polarization analyzer.

Preferably, the detector assembly further includes a controller and optical fiber couplers, the optical fiber couplers being connected to the detectors and the electronic readers, and the controller being connected to the electronic readers.

Preferably, each detector is a photodetector. The maximum acquisition frequency is 40 GHz, and the minimum acquisition time is 25 ps.

Preferably, the electronic reader is an oscilloscope.

The present invention provides a material transport property measurement method, including the following steps: a step of illuminating the sample material with a polarized light; a step of detecting multiple light signals produced by the reflected light from the sample after passing through an integrated polarization analyzer; a step of converting the multiple light signals to corresponding multiple first electrical signals and outputting them; a step of using a non-contact method to measure a temperature parameter of the sample, converting the temperature parameter to a second electrical signal and outputting it; and a step of analyzing the second and the multiple first electrical signals to obtain the transport property parameters of the material.

Preferably, the material transport property parameters include the dc conductivity $\sigma_0$ and the plasma frequency $\omega_p$. They are obtained by first measuring the plasma frequency $\omega_p$ using the ellipsometry apparatus, then adjusting the frequency co of the light source of the ellipsometry apparatus so that it equals the plasma frequency $\omega_p$, and then rapidly and accurately obtain the dc conductivity $\sigma_0$.

Compared with the conventional art, the material transport property measurement system 10 according to embodiments of the present invention has the following advantages:

1. Through the non-contact measurement using the ellipsometry apparatus and the heat capacity measurement system, the transport properties of the material M can be measured without damage to the example. This avoids damage to the sample due to contact with the measurement apparatus. Thus, the material transport property measurement system has minimum limitations in terms of the sample material, so it can be widely used.

At the same time, the system solves the problem of surface sensitivity of the transport properties of some materials and the problem of slow measurement speed.

Further, by using the detector assembly to obtain multiple first electrical signals from the multiple light signals that passed through the integrated polarization analyzer, each first electrical signal conveys information about one polarization angle, which speeds up the signal analysis.

2. Because the multiple polarizers and multiple detectors are paired one-to-one, each detector only needs to obtain data of one polarized light outputted by one polarizer, so the data acquisition efficiency is high, allowing the data acquisition time to be as fast as nanoseconds to measure high speed dynamic parameters.

3. Because the multiple electronic readers and multiple detectors are paired one-to-one as well, each electronic reader only needs to read out optical signal detected by the corresponding detector and convert the signal to electrical signal, so the optical data conversion efficiency is high, and the data acquisition time of the ellipsometry system can be as fast as nanoseconds, which realizes high throughput dynamic measurement of physical properties.

4. Using a beam expander located between the sample stage and the integrated polarization analyzer to expand the polarized light to increase its beam diameter and reduce its divergence angle facilitates collection of the polarized light signal.

DETAILED DESCRIPTION OF PREFERRED EMBODIMENTS

The present invention will be further described in detail below with reference to the accompanying drawings and embodiments. It is understood that the specific embodiments described herein are merely illustrative of the invention and are not intended to limit the invention.

It should be noted that in the descriptions, when one component is said to be provided or disposed in or on another component, the former component may be connected to the other component of be contained in the other component. Also, terms such as perpendicular, horizontal, up, down, etc. are explanatory and not limiting.

Figure 1:
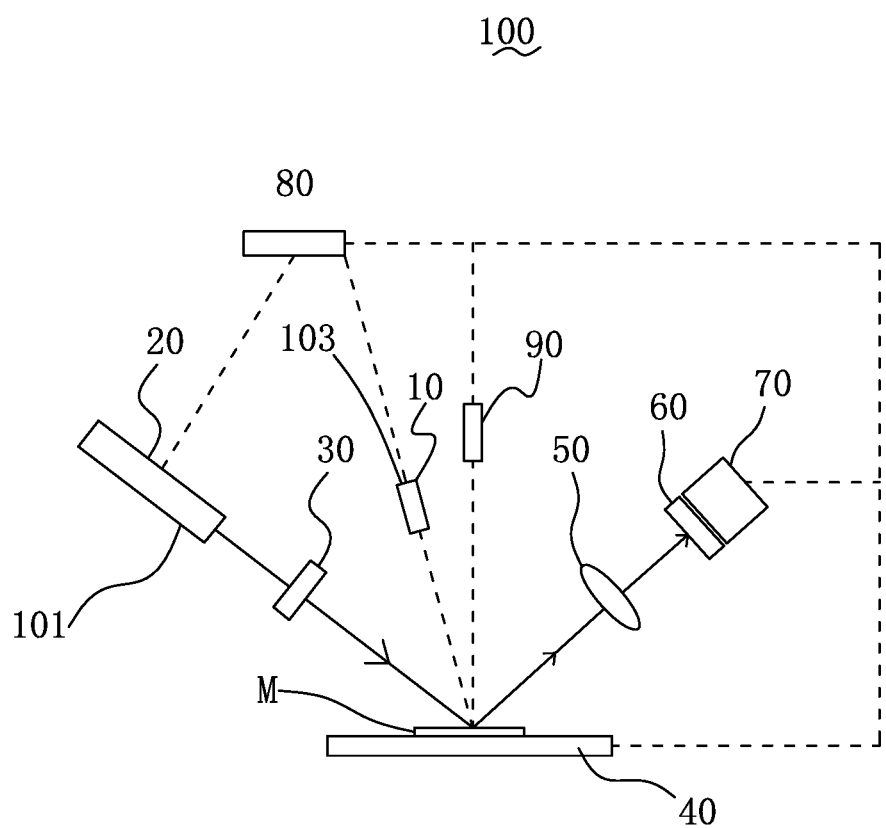
FIG. 1 is a schematic diagram of a system for material transport properties measurement according to an embodiment of the present invention.

As shown in FIG. 1, the first embodiment of the present invention provides a material transport properties measurement system 100. It includes an ellipsometry apparatus 101 and a heat capacity measurement system 103 electrically connected to a controller 80. The ellipsometry apparatus 101 includes a light source 20, a polarizer 30, a sample stage 40, a beam expander lens 50, an integrated polarization analyzer 60, a detector assembly 70, and a controller 80. The heat capacity measurement system 103 includes a thermometer 10 and a temperature controller 90.

The light source 20, the polarizer 30, the sample stage 40, the beam expander lens 50, the integrated polarization analyzer 60, and the detector assembly 70 are sequentially disposed along the optical path. The controller 80 is electrically connected to the light source 20, the sample stage 40, the integrated polarization analyzer 60, the detector assembly 70, the thermometer 10, and the temperature controller 90, and is programmed and controlled by a software program such as Labview to realize automatic control of the measurement process and data acquisition and analysis.

Figure 2:
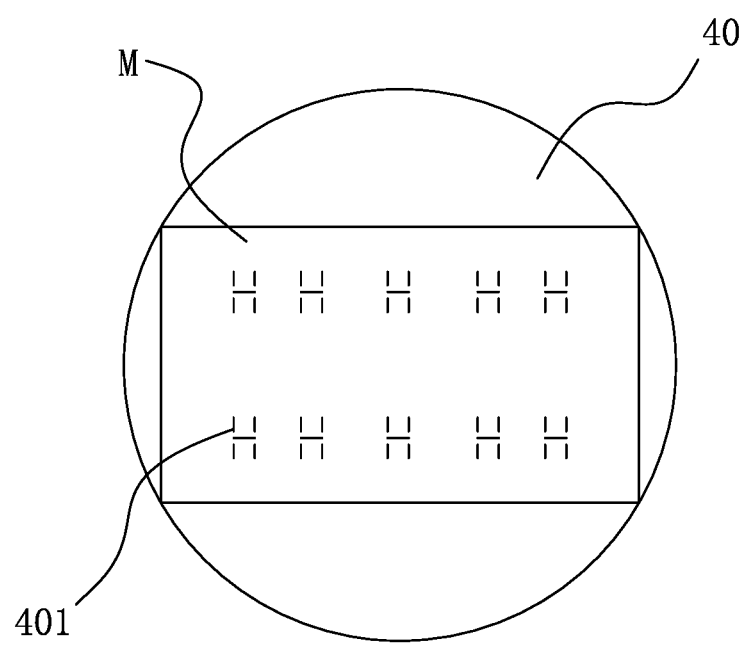
FIG. 2 is a schematic diagram of the sample stage of the material transport properties measurement system.

As shown in FIG. 2, the sample M is mounted on the sample stage 40. There are several vacuum suction grooves 401 on the sample stage 40. When the sample M is placed over the suction grooves 401, and a vacuum pump (not shown) connected to the suction grooves 401 is turned on, the negative pressure of the suction grooves 401 secures the sample on the sample stage 40. To enhance the suction power, the contact surface between the suction grooves 401 and the sample M may be made into a ring shape, a double ring shape, an H shape, or a star shape to increase the contact surface between the suction grooves 401 and the sample M.

Both the thermometer 10 and the temperature controller 90 can be disposed around the sample stage 40 or on the sample stage 40. The thermometer 10 and the temperature controller 90 cooperate to detect the temperature of the sample M and/or the ambient temperature around the sample M, to obtain a function C(T) of the heat capacity of the sample M as a function of temperature T. The heat capacity of the sample M includes the electron heat capacity $C_e$ and the phonon heat capacity $C_p$. Preferably, the thermometer 10 is an infrared thermometer, such as a TeGeHg infrared detector. The temperature controller 90 is preferably a pulsed laser, for example, a laser with wavelength of 1064 nm and adjustable pulse width of 5 ns to 1 us, which can rapidly heat the material.

The light source 20 is a laser. Preferably, a He—Ne gas laser with wavelength 632.8 nm is used. Preferably, the polarizer 30 is a Glan-Foucault polarized made of calcite.

The light emitted by the light source 20 passes through the polarizer 30 and becomes linear polarized light and is incident on the sample M. The incident polarized light on the sample M is reflected from the sample surface. The reflected polarized light is expanded after passing through the beam expander 50. It then passes through the integrated polarization analyzer 60 and the multiple linear polarized beams after the integrated polarization analyzer are detected by the detector assembly 70. The detected signals are transferred to controller 80 for analysis to obtain optical constants of the sample.

The beam expander 50 is located between the sample stage 40 and the integrated polarization analyzer 60. It expands the diameter of the beam and reduces the divergence angle of the beam to facilitate collection by the integrated polarization analyzer. Preferably, the expansion ratio of the beam expander 50 is approximately 5 to 10.

Figure 3A:
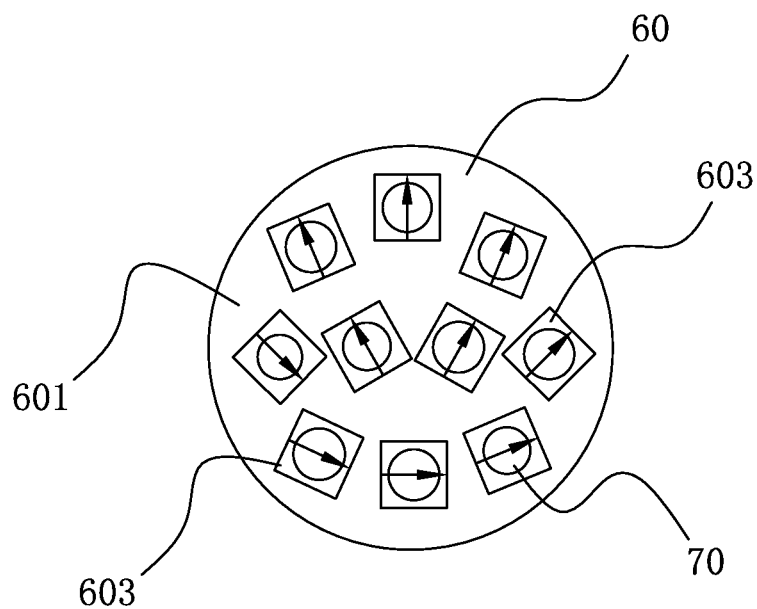
FIG. 3A is a schematic diagram of the structure of an integrated polarization analyzer and corresponding detectors of the material transport properties measurement system.
Figure 3B:
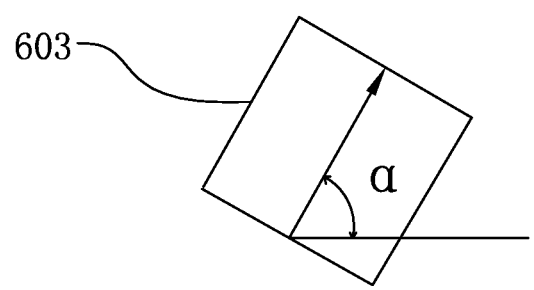
FIG. 3B is a schematic diagram of the orientations of the polarizers in the integrated polarization analyzer of the material transport properties measurement system.
Figure 4:
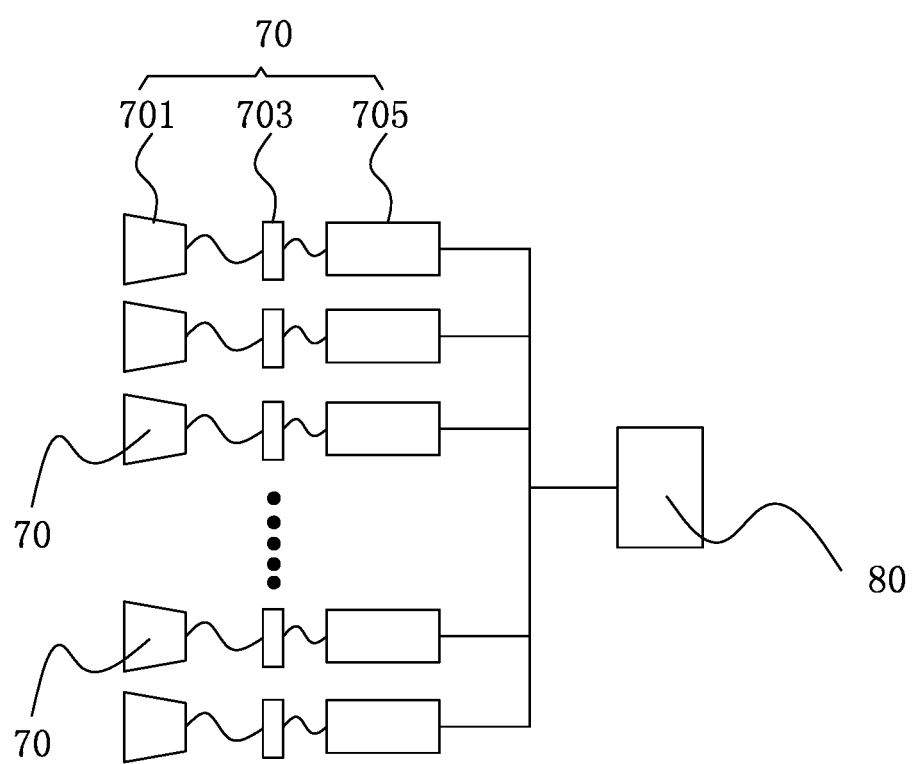
FIG. 4 is a schematic diagram of the structure of detector assembly and the controller of the material transport properties measurement apparatus.

Referring to FIGS. 3A-3B and 4, the integrated polarization analyzer 60 including a frame 601 and a plurality of polarizers 603. In one example, the frame 601 is made of aluminum with diameter 9.5 mm and thickness 2 mm. There are N polarizers 603 mounted on the frame 601, where N is a positive integer, for example, 1, 2, or 3 or more, and preferably it is 10. The polarization orientations of the polarizers are indicated by their orientation angles α, distributed from 0 to 180 degrees. The orientation angles α may be distributed uniformly or non-uniformly.

More specifically, the integrated polarization analyzer 60 has N through holes (e.g. square through holes) on the frame 601, at different orientations distributed approximately uniformly between 0 to 180 degrees. The polarizers have approximately the same size as the through holes, and are placed into the through holes according to the polarization direction of the polarizers, so that the polarization directions of the polarizers are different and are distributed approximately uniformly between 0 to 180 degrees. As a result, the output light after the integrated polarization analyzer 60 have different polarization states.

The number of polarizers 603 determines the number of data points of different linear polarizations that can be obtained at once using the integrated polarization analyzer 60. The orientation angles α of polarizers 603 may be adjusted to determine the polarization state of each polarizer 603. By uniformly distributing the orientation angles of the multiple polarizers 603, data for different orientation angles can be obtained. The angular distance between polarizers 603 is determined by the number of polarizers used; when more polarizers 603 are used, the angular distance between polarizers 603 is smaller, and vice versa.

Behind each polarizer 603, there is an independent detector assembly 70, for detecting the light intensity that passed through the corresponding polarizer 603. The light intensity is converted to an electrical signal and transferred to the controlled 80. The controller 80 processes the data from the detector assembly 70 to obtain one or more optical properties of the sample M.

The detector assembly 70 contains multiple detectors 703 and multiple electronic readers 705. A Newport Photodetectors 1014 photoelectric detector is used as detector 703 in one example. Its acquisition frequency is 40 GHz, means the acquisition time could be 25 μs, suitable for detecting high speed dynamic data from the polarizers 603 which is in the nanosecond scale.

Each electronic reader 705 can readout the signal from the detector 703 and display the data and/or transmit the data to the controller 80. Preferably, an oscilloscope having a sample rage of 10 GHz is used as the electronic reader 705. The electronic reader 705 is connected to the detector 703, and can increase the signal measuring speed to 1 GHz.

Because each polarizer 603 can only pass polarized light in a particular direction, by providing an independent detector 703 for each polarizer 603, the detector 703 only needs to detect a single polarized light that has passed through one polarizer, resulting in high efficiency in optical data sampling that can measure the high speed dynamic data from the polarizer 603 which is on the nanosecond scale.

Also, the detector 703 are photoelectric detectors, which can better detect the optical signals from the polarizer 603 and convert it to electrical signal.

Further, by providing an electronic reader 705 for each detector 703, i.e. a one to one correspondence between the electronic readers 705 and the detectors 703, each electronic reader 705 only needs to read out the data detected by the corresponding detector 703, and display and/or transmit the electrical signal corresponding to the optical signal, high efficiency conversion from optical signal to electrical signal is achieved, so that nanosecond measurement speed of the overall ellipsometry apparatus can be achieved. This enables dynamic measurement of a large number of physical properties of materials, and provides data for understanding material optical properties.

In this embodiment, each detector 703 is coupled to the corresponding polarizer 603 via an optical fiber coupler 701, to collect the optical signal from the polarizer 603. An optical fiber coupler 701 and its corresponding detector 703 and electronic reader 705 form a detector channel, to detect the optical signal from the corresponding polarizer 603.

It should be understood that in this embodiment, each detector 703 detects the light that passed through a single polarizer 603, and converts the light signal to an electrical signal. The electronic readers 705 correspond one-to-one with the detectors 703, each electronic reader 705 reads out the corresponding electrical signal, and displays it and/or transmits it to the controller 80 to be analyzed. This way, the ability to detect and analyze the light signal outputted by each single polarizer 603 is enhanced, and the measurement speed is increased to nanosecond range, allowing more comprehensive measurement of material optical properties. Thus, the structure where the polarizers 603, the detectors 703 and electronic readers 705 are correspond to each other one-to-one is a preferred structure which allows for faster detection of the optical signal transmitted by the polarizers 603.

It should be understood that a number of controllers 80 can also be provided in a one-to-one correspondence with the electronic readers 705, to process the electrical signal from the electronic reader 705.

Figure 5:
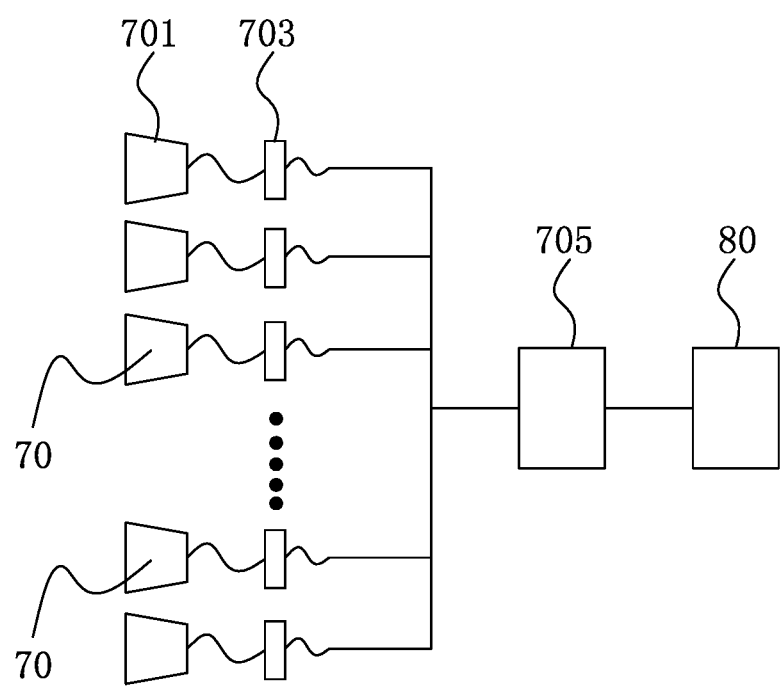
FIG. 5 is a schematic diagram of an alternative structure of the detector assembly and the controller of the material transport properties measurement apparatus.

An alternative embodiment is shown in FIG. 5. Different from the first embodiment described earlier, the electrical reader 705 and the detector 703 is not connected one-to-one. Instead, multiple detectors 703 share one, two or more electrical readers 705, and the electronic readers 705 are connected to controllers 80. The controller 80 may have a one-to-one correspondence with the multiple electronic readers 705, or a non one-to-one correspondence. In this case, powerful electronic readers 705 are required to satisfy the reading speed.

Figure 6:
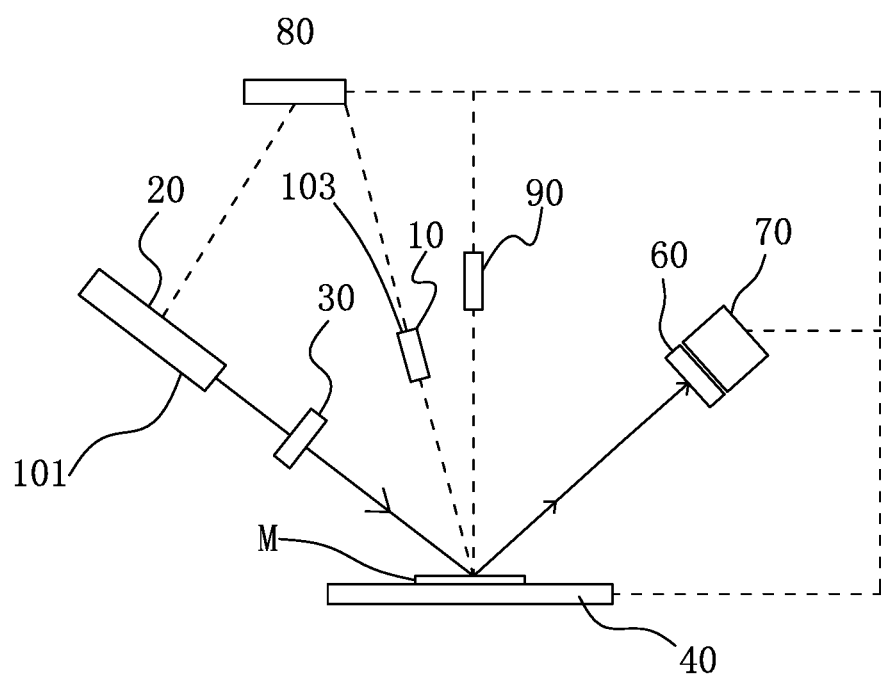
FIG. 6 is a schematic diagram of an alternative material transport properties measurement system according to an embodiment of the present invention.

Another alternative embodiment of an ellipsometry apparatus 100' is shown in FIG. 6. Different from the first embodiment described earlier, the ellipsometry apparatus does not have a beam expander 50. The light from the light source 20 passes through the polarizer 20 to be incident on the sample M on the sample stage 40. The light reflected by the sample M is incident in the integrated polarization analyzer 60. The detector assembly 70 detects the polarized light signals and converts them to electrical signals which is transmitted to the controller 80. The controller 80 processes the electrical signal.

The method for determining the material optical properties using the material transport property measurement system is as follows:

Ellipsometry is an important method for measuring material optical property spectra. The ellipsometry apparatus 101 is used to measure the dielectric constant spectrum of the sample M. Based on the dielectric constant spectrum, the plasma frequency $\omega_p$, the zero-frequency conductivity $\sigma_0$ and relaxation time $\tau$ can be determined.

Having obtained the plasma frequency $\omega_p$ using ellipsometry, the imaginary part of the dielectric constant $\varepsilon_i(\omega)$ of the sample satisfy:

$$\varepsilon_i(\omega) = \frac{\omega_p^2}{\omega^3} \frac{\gamma}{1+(\gamma/\omega)^2} + \Sigma L_n(\omega)$$

Where $\gamma$ is the damping frequency. The light source 20 is changed to an far ultraviolet light source, and when the frequency $\omega$ of the light source 20 is equal to or approximately equal to the plasma frequency $\omega_p$ of the sample, the Lorentz term $\Sigma L_n(\omega)$ can be omitted, and the imaginary part of the dielectric constant spectrum $\varepsilon_i(\omega)$ can be simplified as:

$$\varepsilon_i(\omega) = \frac{\omega_p^2}{\omega^3} \frac{\gamma}{1+(\gamma/\omega)^2} + \Sigma L_n(\omega) = \frac{\gamma}{\omega_p}$$

Thus, the dc conductivity $\sigma_0$ of the sample M can be rapidly and accurately determined.

The temperature dependent heat capacity $C(T)$ of the sample M may be determined by a differential scanning calorimetry (DSC) method, or an optical heat capacity measurement method such as that described in Chinese patent application CN201810005079.5. By using the heat capacity measurement system 103 to change the temperature T and obtain the temperature dependent heat capacity $C(T)$, the Fermi temperature $T_F$ of the sample can be determined from $C(T)$. The temperature dependency of the heat capacity $C(T)$ is described in C. Kittel, Introduction to Solid State Physics (2004).

The heat capacity mainly includes two parts: the electronic heat capacity and the phonon heat capacity, which satisfy the following relationship:

$$C(T) = C_p(T) + C_e(T) \approx \frac{12\pi^4 k_B}{5T_D^3}T^3 + \frac{\pi^2 k_B^2}{2T_F}T$$

Where, T is temperature, $T_D$ is Debye temperature, $T_F$ is Fermi temperature. The two satisfy the following formula:

$$T_F = \frac{\hbar^2}{2m_e^* k_B} \cdot (3\pi^2 n_e)^{2/3}$$

$$T_D = \frac{\hbar v}{k_B} \cdot (6\pi^2 n_c)^{1/3}$$

Where, v is the speed of sound; $n_c$ is the number of lattices per unit volume.

From the direct current conductivity $\sigma_0$, the plasma frequency $\omega_p$, and the temperature dependent heat capacity $C(T)$, transport properties such as the carrier concentration $n_e$, electron effective mass $m^*_e$, and mobility $\mu$ can be calculated using the following equations:

$$n_e = \left(\frac{\omega_p^2}{T_F}\right)^3 \left(\frac{\varepsilon_0 \hbar^2}{2e^2 k_B}\right)^3 9\pi^4$$

$$m_e^* = \frac{n_e e^2}{\omega_p^2 \varepsilon_0}$$

$$\mu = \frac{n_e e}{\sigma_0}$$

Where $\varepsilon_0$ is the dielectric constant of vacuum, $k_B$ is the Boltzmann constant, and h is the Planck constant.

Thus, transport property parameters of the material M, including the dc conductivity $\sigma_0$, the plasma frequency $\omega_p$, the relaxation time $\tau$, the carrier concentration $n_e$, the electron effective mass $m^*_e$, and the mobility $\mu$, can all be obtained at once.

Thus, the dielectric constant spectrum of the material M can be used to obtain the dc conductivity $\sigma_0$, the plasma frequency $\omega_p$, the relaxation time $\tau$, the temperature dependent heat capacity $C(T)$, the Fermi temperature $T_F$, the carrier concentration $n_e$, the electron effective mass $m^*_e$, and the mobility $\mu$, of the material, by the controller 80 through computation.

Embodiments of this invention adopt the non-contact measurement technologies, including the ellipsometry system 101 and the heat capacity measurement system 10, to measure optical properties of the sample, including transport properties such as the direct current conductivity $\sigma_0$, the relaxation time $\tau$, the plasma frequency $\omega_p$, the carrier concentration $n_e$, the electron effective mass $m^*_e$, the mobility $\mu$, and so on, without damaging the sample. The method avoids damage to the sample due to contact of the measurement apparatus with the sample, so the measurement system has minimum limitations in terms of the sample material, and has wide applications.

At the same time, by the non-contact measurement using the ellipsometry system 101 and the heat capacity measurement system 103, the surface sensitivity and the slow measurement speed problems of conventional technologies are solved.

Further, the ellipsometry system 101 can measure optical property parameters in nanosecond time scale, which can be used for dynamic measurement with high throughput.

Figure 7:
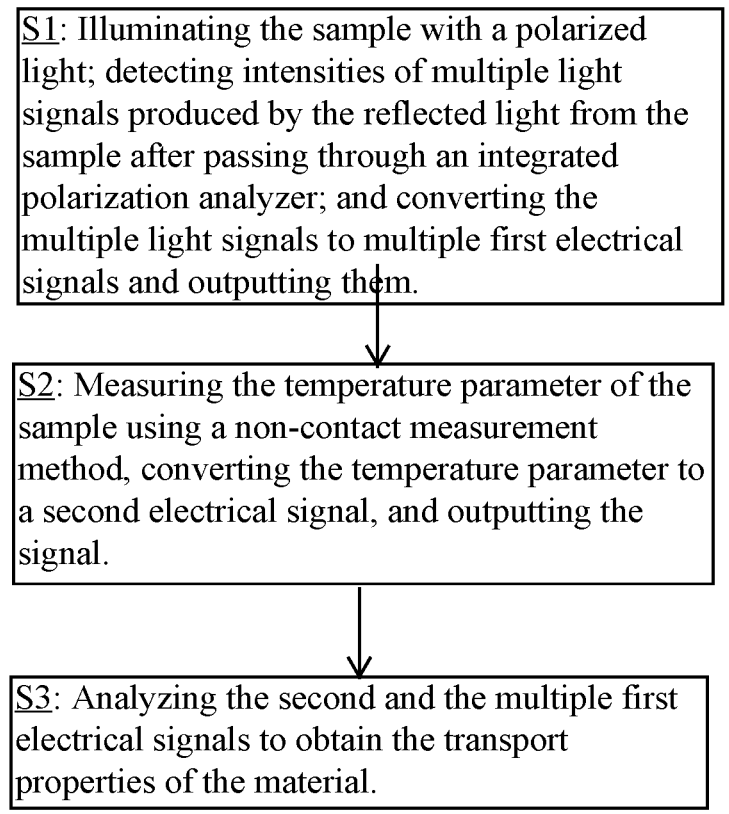
FIG. 7 is a flowchart of a method for measuring material transport properties according to an embodiment of the present invention.

Referring to FIG. 7, the present invention provides a method for measuring the transport properties of materials. It contains following steps:

Step S1: Illuminating the sample with a polarized light; detecting intensities of multiple light signals produced by the reflected light from the sample after passing through an integrated polarization analyzer; and converting the multiple light signals to multiple first electrical signals and outputting them.

Figure 8:
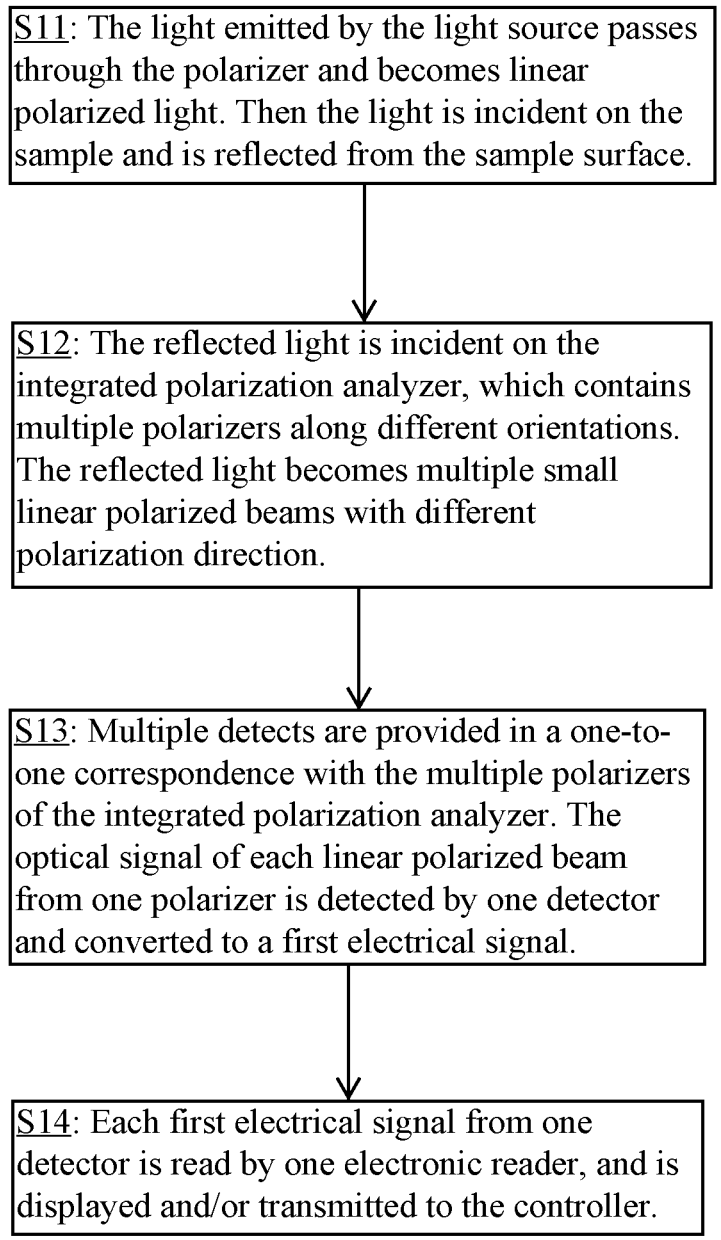
FIG. 8 is a flowchart of step S1 of the material transport properties measuring method according to an embodiment of the present invention.

Referring to FIG. 8, step S1 includes the following steps:

Step S11: The light emitted by the light source passes through the polarizer and becomes linear polarized light. Then the light is incident on the sample and is reflected from the sample surface.

Step S12: The reflected light is incident on the integrated polarization analyzer, which contains multiple polarizers along different orientations. The reflected light becomes multiple small linear polarized beams with different polarization direction.

Step S13: Multiple detects are provided in a one-to-one correspondence with the multiple polarizers of the integrated polarization analyzer. The optical signal of each linear polarized beam from one polarizer is detected by one detector and converted to a first electrical signal.

Step S14: Each first electrical signal from one detector is read by one electronic reader, and is displayed and/or transmitted to the controller.

Further, a step S111 may be performed between steps S11 and S12:

Step S111: The polarized light reflected from the sample M is expanded by the beam expander before entering the integrated polarization analyzer.

Preferably, the light source in step S11 is a He—Ne gas laser with wavelength 632.8 nm.

Preferably, each detector in step S12 is a photodetector. The maximum acquisition frequency is 40 GHz, which means 25 ps acquisition speed.

Preferably, in step S14, the electronic readers have a one-to-one correspondence with the detectors, to independently read out the signal detected by each detector.

Step S2: Measuring the temperature parameter of the sample using a non-contact measurement method, converting the temperature parameter to a second electrical signal, and outputting the signal.

Specifically, the heat capacity measurement device includes a thermometer 10 and a temperature controller 90. The temperature controller 90 emits a laser pulse to heat the sample. The thermometer 10 measures the temperature parameter using infrared detection, converts it to the second electrical signal, and outputs the signal to the controller 80.

Step S3: Analyzing the second and the multiple first electrical signals to obtain the transport properties of the material.

In step S3, the material transport properties include the direct current conductivity $\sigma_0$, the relaxation time $\tau$, the plasma frequency $\omega_p$, the carrier concentration $n_e$, the electron effective mass $m^*_e$, and the mobility $\mu$.

In step S3, the plasma frequency $\omega_p$ is first measured by the ellipsometry system; and then the frequency of the light source of the ellipsometry system is adjusted to be equal to or approximately equal to the plasma frequency $\omega_p$, to simplify the imaginary part of the dielectric constants spectrum $\varepsilon_i(\omega)$, to rapidly and accurately obtain the dc conductivity $\sigma_0$ of the material M.

In one embodiment, the material transport property measurement method include the following:

(1) Setting the temperature of the sample stage 40, turning on the infrared thermometer 10 and the high-speed ellipsometry system 101 by the controller 80. Then, calibrate the dielectric constant dispersion spectrum $\tilde{\varepsilon}(\omega)$ of the material at different temperatures.

(2) Obtaining the imaginary part and the real part of the dielectric constants $\tilde{\varepsilon}(\omega)$ of the material at given temperature by the high-speed ellipsometry system 101 controlled by the controller 80. Then, the dc conductivity $\sigma_0$ and the plasma frequency $\omega_p$ of the material can be calculated according to the dielectric constant dispersion spectrum $\tilde{\varepsilon}(\omega)$. The calculation details are described in U.S. Provisional Application No. 62/500,335, published as WIPO Published Application WO 2018/204545 A1.

(3) Turning on the pulse laser 90 and the high-speed ellipsometry system 101 by the controller 80 to determine the temperature dependent heat capacity C(T). The calculating details are described in CN Application No. 201711165318.5, published as CN 107941850 A.

(4) Using the equations described earlier, the transport properties of the material including DC conductivity $\sigma_0$, carrier concentration $n_e$, relaxation time $\tau$, electron effective mass $m^*_e$, and mobility $\mu$ are calculated.

Compared with conventional technologies, the material transport property measurement system 100 of the present invention has the following advantages:

1. Through the non-contact measurement of the ellipsometry system and the heat capacity measurement system, the transport properties of the material M can be measured without damaging the sample. The method avoids damage to the sample due to contact of the measurement apparatus with the sample, so the measurement system has minimum limitations in terms of the sample material and has wide applications.

At the same time, the system solves the problem of surface sensitivity of the transport properties of some materials and the problem of slow measurement speed.

Further, by using the detector assembly to obtain multiple first electrical signals from the multiple light signals detected by the integrated polarization analyzer, each first electrical signal conveys information about one polarization angle, which speeds up the signal analysis.

2. Because the multiple polarizers and multiple detectors are paired one-to-one, each detector only needs to obtain data of one polarized light outputted by one polarizer, the data acquisition efficiency is high, allowing the data acquisition time to be as fast as nanoseconds to measure high speed dynamic parameters.

3. Because the multiple electronic readers and multiple detectors are paired one-to-one as well, each electronic reader only needs to read out optical signal detected by the corresponding detector and convert the signal to electrical signal, the optical data conversion efficiency is high, and the data acquisition time of the ellipsometry system can be as fast as nanoseconds, which realizes high throughput dynamic measurement of physical properties.

4. Using a beam expander located between the sample stage and the integrated polarization analyzer to expand the polarized light to increase its beam diameter and reduce its divergence angle facilitates collection of the polarized light signal.

The method for rapid elliptical polarized light measurement according to other embodiments of the present invention has the above advantages.

Instead of ellipsometry, the optical property measurement system may alternatively be q reflectivity measurement system.

Various modification and variations can be made in the apparatus and method of the present invention without departing from the spirit or scope of the invention. Thus, it is intended that the present invention cover modifications and variations that come within the scope of the appended claims and their equivalents.

What is claimed is:

1. A transport properties measurement apparatus, comprising:
    an ellipsometry apparatus, a heat capacity measurement system, and a controller, wherein the ellipsometry apparatus and the heat capacity measurement system are electrically connected to the controller;
    wherein the ellipsometry apparatus comprises a light source, a polarizer, a sample stage, an integrated polarization analyzer, and a detector assembly disposed along an optical path;
    wherein the sample stage is configured to support a sample being measured, wherein a light emitted by the light source passes through the polarizer and shines on the sample, and the light is reflected from the sample to the integrated polarization analyzer;

wherein multiple polarized light reflected from the sample enter the integrated polarization analyzer, wherein the detector assembly is connected to the integrated polarization analyzer to detect the multiple light signals, to convert the multiple light signals to multiple first electrical signals, and to output the multiple first electrical signals to the controller;

wherein the heat capacity measurement system includes a thermometer and a temperature controller and is configured to measure the temperature parameter of the sample using non-contact measurement, to convert the temperature parameter to a second electrical signal, and to output the second electrical signal to the controller; and wherein the controller obtains one or more transport properties of the material by analyzing the second and the multiple first electrical signals.

2. The transport properties measurement apparatus of claim 1, wherein the analyzer includes multiple polarizers with different orientation angles distributed from 0 to 180 degrees, configured to receive the light reflected from the sample; and wherein the detector assembly includes multiple detectors, which correspond one-to-one with the multiple polarizers, configured to independently determine the light intensity outputted by the corresponding polarizers.

3. The transport properties measurement apparatus of claim 2, wherein the detector assembly further includes multiple electronic readers, coupled to the multiple detectors.

4. The transport properties measurement apparatus of claim 3, wherein the multiple electronic readers correspond one-to-one with the multiple detectors and are configured to independently obtain electrical signals from the corresponding detectors.

5. The transport properties measurement apparatus of claim 1, further comprising a beam expander disposed on an optical path between the sample stage and the integrated polarization analyzer, configured to expand a light beam reflected from the sample before the light is input to the integrated polarization analyzer.

6. The transport properties measurement apparatus of claim 1, further comprising multiple optical fiber couplers, the multiple optical fiber couplers being coupled to the detectors and the electronic readers, and the controller being coupled to the electronic readers.

7. The transport properties measurement apparatus of claim 1, wherein each detector is a photodetector with a maximum acquisition frequency of 40 GHz and a minimum acquisition time of 25 ps.

8. The transport properties measurement apparatus of claim 1, wherein the electronic readers are oscilloscopes.

9. The transport properties measurement apparatus of claim 1, wherein the one or more transport properties of the material include at least one of dc (direct current) conductivity $\sigma_0$, carrier concentration $n_e$, relaxation time $\tau$, electron effective mass $m_e^*$, and mobility $\mu$.

10. A method of measuring transport properties of a material, comprising the steps of:

illuminating the sample with a polarized light;

detecting multiple light signals produced by reflected light from the sample after passing through an integrated polarization analyzer, and converting the multiple light signals to multiple first electrical signals and outputting the multiple first electrical signals;

measuring a temperature parameter of the sample using a non-contact measurement method, converting the temperature parameter to a second electrical signal and outputting the second electrical signal; and obtaining one or more transport properties of the material based on the second electrical signal and the multiple first electrical signals.

11. The method of claim 10, wherein the one or more transport properties of the material include a direct current conductivity $\sigma_0$ and a plasma frequency $\omega_p$, wherein the plasma frequency $\omega_p$ is first measured by the ellipsometry apparatus, and then the frequency of the light source of the ellipsometry apparatus is adjusted to be equal to or approximately equal to the plasma frequency $\omega_p$, to measure the dc conductivity $\sigma_0$ of the material.

12. The method of claim 10, wherein the one or more transport properties of the material include at least one of dc (direct current) conductivity $\sigma_0$, carrier concentration $n_e$, relaxation time $\tau$, electron effective mass $m_e^*$, and mobility $\mu$.

* * * * *